Oct. 29, 1968 K. A. BRANDENBERG 3,407,846

CIRCUIT BOARD AND CONTROL MODULE FOR FLUID LOGIC CIRCUIT MECHANISM

Filed July 14, 1966 3 Sheets-Sheet 1

INVENTOR.
KARL A. BRANDENBERG
BY Bair, Freeman & Molinare
ATTORNEYS

INVENTOR.
KARL A. BRANDENBERG
BY Bair, Freeman
& Molinare
ATTORNEYS

Oct. 29, 1968 K. A. BRANDENBERG 3,407,846

CIRCUIT BOARD AND CONTROL MODULE FOR FLUID LOGIC CIRCUIT MECHANISM

Filed July 14, 1966 3 Sheets-Sheet 3

INVENTOR.
KARL A. BRANDENBERG
BY Bair, Freeman & Molinare
ATTORNEYS

United States Patent Office 3,407,846

Patented Oct. 29, 1968

3,407,846
CIRCUIT BOARD AND CONTROL MODULE FOR FLUID LOGIC CIRCUIT MECHANISM

Karl A. Brandenberg, Hayward, Calif., assignor to The Aro Corporation, Bryan, Ohio, a corporation of Delaware Filed July 14, 1966, Ser. No. 565,246
11 Claims. (Cl. 137—608)

This invention relates to a circuit board and control or circuit module for fluid logic circuit mechanisms of the general type shown in my copending application, Ser. No. 479,758, filed Aug. 16, 1965.

One object of the present invention is to provide a circuit board somewhat similar to that shown in my copending application but which is designed to include a control or circuit module in the form of a special type of gasket in place of the flat gasket sheet shown in the copending application, the present control module being designed for ease of adaptation to a circuit pattern without the necessity of having to carve fluid pressure passageways into such gasket sheet.

Another object is to provide a control module in the form of a molded gasket having a pattern of circuit openings across its surface wherein certain openings may be opened into each other by cutting out the intervening partitions in accordance with a desired circuit pattern.

Another object is to provide a molded gasket having a plurality of O-ring elements repeated in pattern-like manner interspersed with the circuit openings just referred to wherein the O-ring elements seal around mounting screws and the like to prevent fluid pressure leaks around such mounting screws yet provide for an easily established circuit pattern by the removal of certain partitions between the circuit openings, the circuit board in which the control module is assembled being provided with circuit openings in communication with the circuit openings of the gasket and in communication with ports of valve units mounted on the circuit board so that predetermined inlet and outlet ports of such valve units may be connected together as desired in order to provide for fluid pressure flow from one to another of such valve units.

Still another object is to provide a circuit board comprising a base plate, a control module and a cover plate wherein one of the plates (preferably the cover plate) is provided with locating grooves for the O-ring elements and partitions of the control module.

A further object is to provide a circuit board and control module which cooperate to allow hydraulic or pneumatic circuits to be built from components without the use of tubing or piping, the control module being so designed as to make possible various flow combinations and to give the necessary versatility in logic functions. This system is primarily designed for industrial applications such as are given in automation. Immediate applications are found where presently logic functions are performed with ordinary valves piped together or where logic functions are accomplished electrically with switches and relays and then converted into pneumatic signals.

Still a further object is to provide a circuit board and control module arrangement wherein the entire fluid pressure circuit is made inside the circuit board assembly, the assembly comprising a base plate with holes connecting the valve elements to the circuit, a control module in gasket form containing the circuit pattern and a cover plate which retains the control module in position.

With these and other objects in view, my present invention consists in the construction, arrangement and combination of the various parts of my circuit board and control module whereby the objects above contemplated are attained, as hereinafter more fully set forth, pointed out in my claims and illustrated in detail on the accompanying drawings, wherein:

Figures 1, 2:
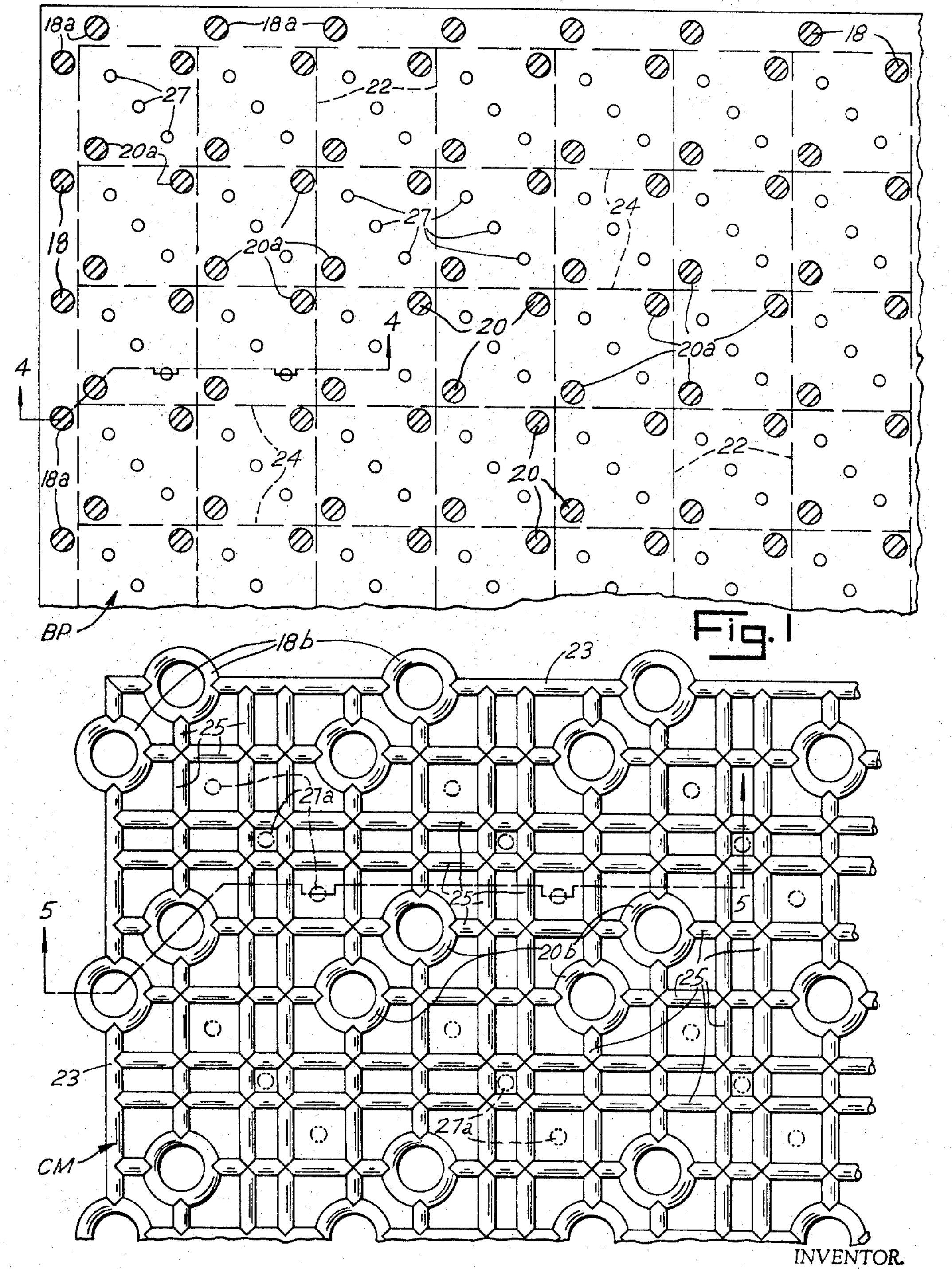
FIG. 1 is a plan view of the upper left corner of a base plate of my circuit board with mounting screws passing therethrough and shown in section.
FIG. 2 is a plan view of the upper left corner of a gasket-type of control module which forms part of the circuit board arrangement, and shows the module at twice the scale of FIG. 1.
Figure 3:
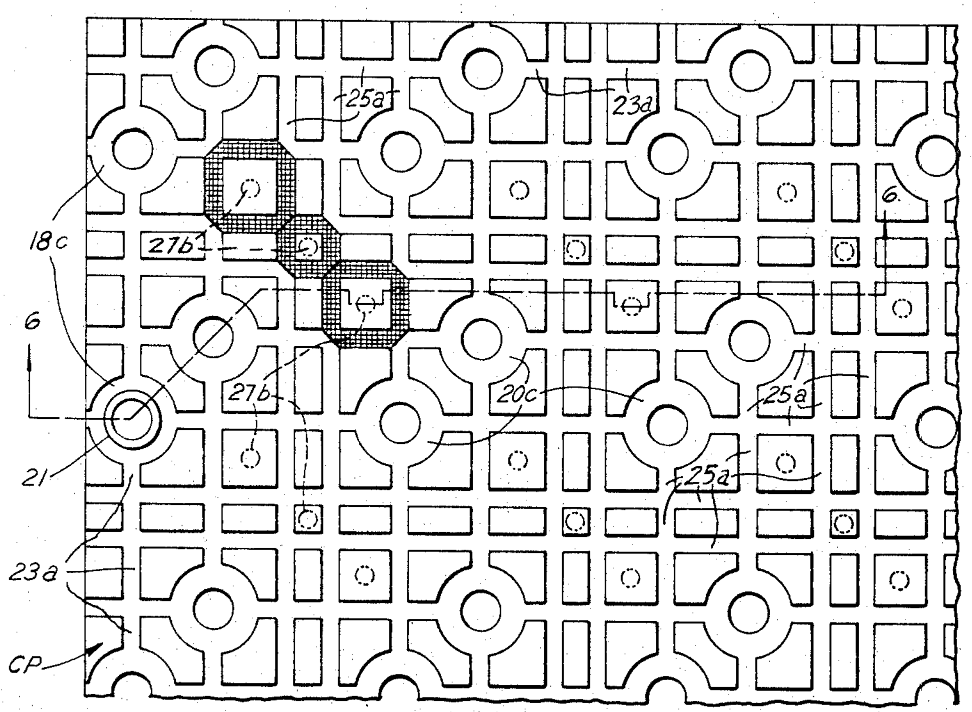
FIG. 3 is a plan view of the upper left corner of a cover plate of the circuit board, the scale being the same as in FIG. 2.
Figures 4, 5, 6, 7:
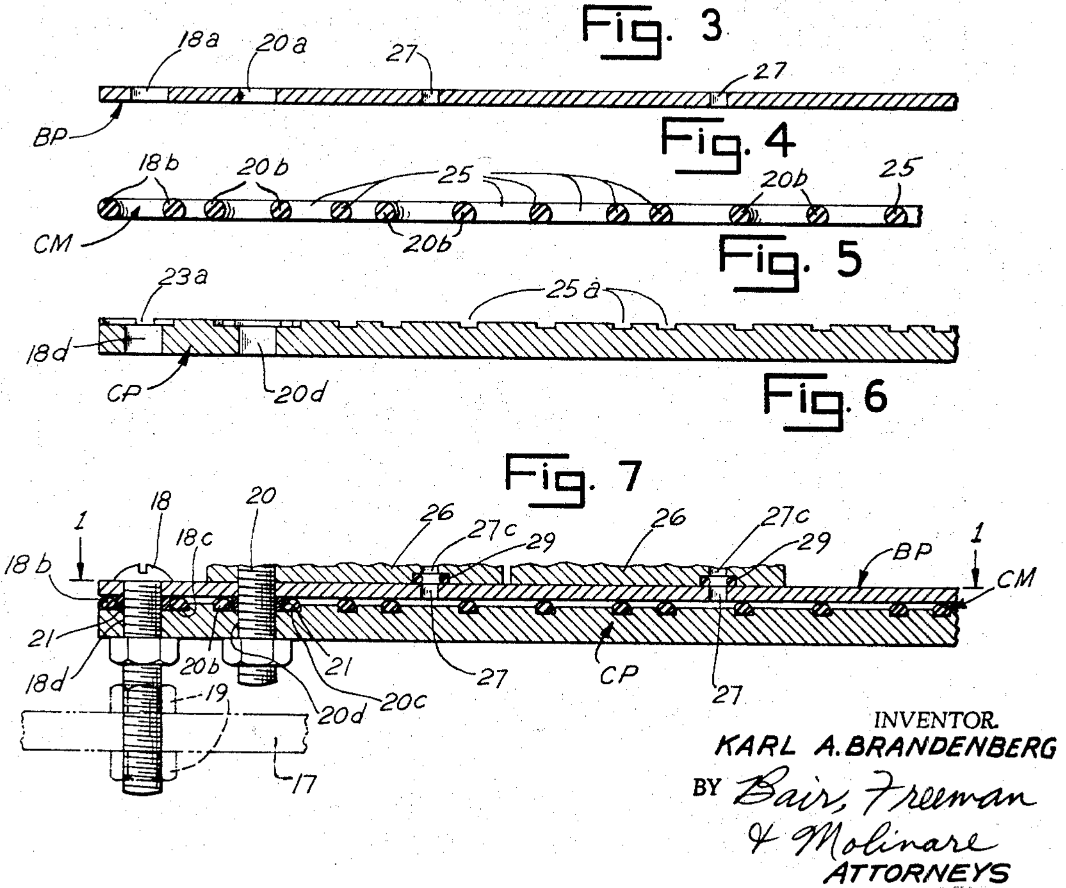
Figure 8:
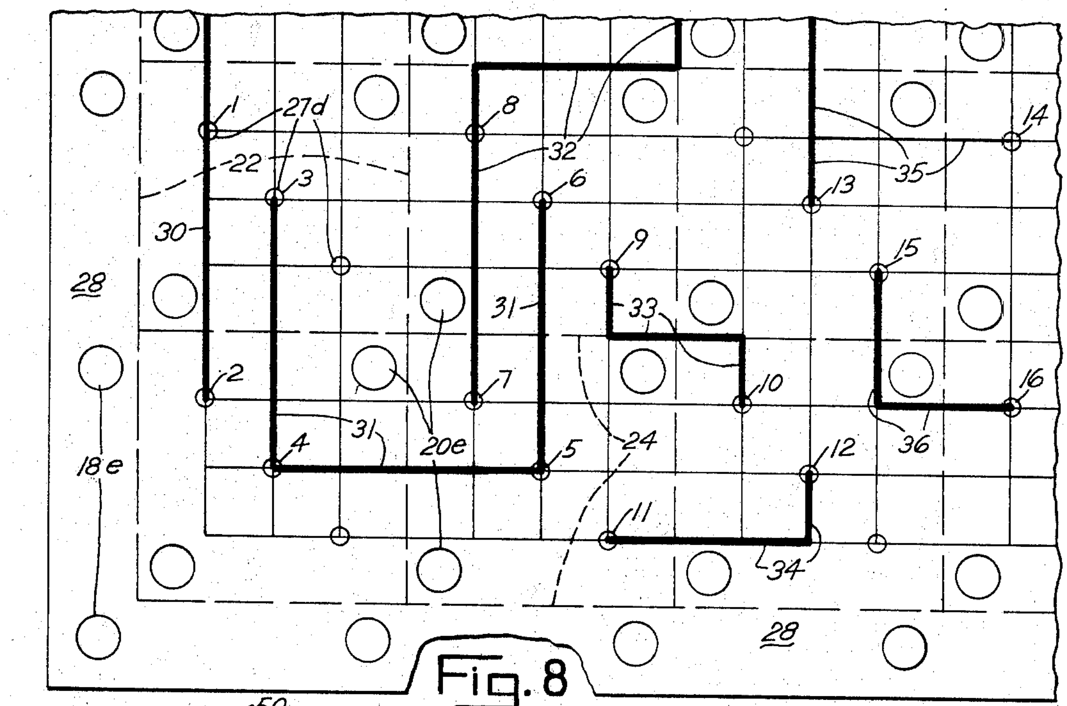
Figure 9:
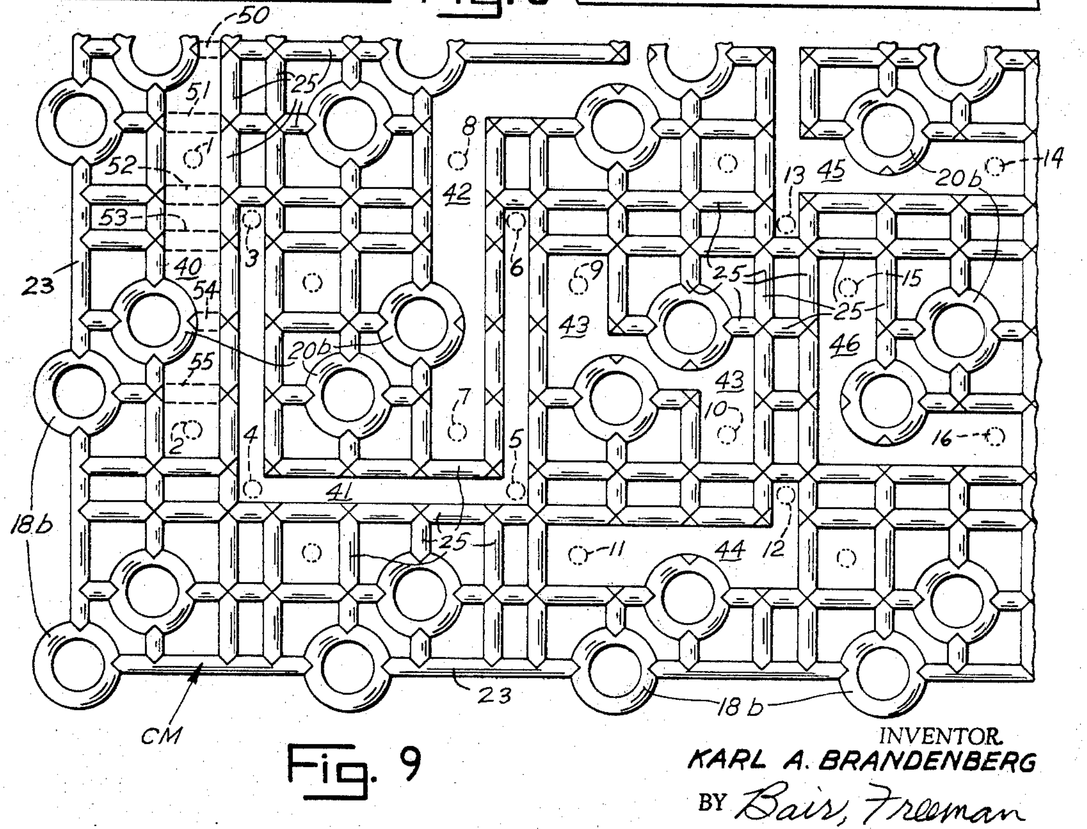

FIG. 4, 5 and 6 are sectional views on the lines 4—4 of FIG. 1 5—5 of FIG. 2 and 6—6 of FIG. 3 showing the base plate, the control module and the cover plate, respectively in cross section, the scale being the same as in FIG. 2;

FIG. 7 is a similar sectional view of the three elements shown in FIGS. 4, 5 and 6, illustrating them assembled together and valve units mounted on the assembly;

FIG. 8 is a plan view of the lower left corner of a circuit pattern sheet which may be used in conjunction with the fabrication of my control module and circuit board assembly; and FIG. 9 is a plan view similar to FIG. 2 except of the lower left corner of the control module showing how certain partitions thereof are cut out to effect the fluid circuit connections laid out in FIG. 8.

On the accompanying drawings I have used the reference character BP to indicate a base plate, CM a control module and CP a cover plate of my circuit board assembly. FIG. 1 shows in full scale one corner of the base plate BP which as shown in FIG. 4 is a relatively thin, flat metal plate having perforations 18*a* through which circuit board mounting screws 18 around the edge extend and has other perforations 20*a* through which valve unit mounting screws 20 extend. Vertical lines 22 and horizontal lines 24 in FIG. 1 indicate the outlines of valve units (such as shown in my copening application) which may be mounted on the base plate BP and FIG. 1 also shows the mounting screws 18 and 20 as taken on a section line 1—1 of FIG. 7.

Each of the valve units has a body 26 (as shown in FIG. 7) and two of the mounting screws 20. The mounting screws 18, in addition to serving as perimetric clamp screws for the elements BP, CM and CP, may serve to mount the circuit board assembly on a panel or the like 17 as by lock nuts 19 shown dotted in FIG. 7. This figure also illustrates the use of spacer rings 21 around the screws 18 and 20 to avoid excessive tightening of O-ring portions 18*b* and 20*b* of the control module CM. One of the spacer rings 21 is also shown in FIG. 3. The cover plate CP has perforations 18*d* and 20*d* for the screws 18 and 20.

The control module CM as shown in FIG. 2 comprises the peripheral O-ring portions 18*b* and a repeated pattern of valve unit mounting screw O-ring portions 20*b* together with a partition 23 which forms a peripheral wall and a plurality of inner partitions 25 which are cylindrical in cross-section as shown in FIG. 5. In FIG. 1 the base plate BP is illustrated as having three ports 27 for each valve unit, the outlines of the valve units being indicated by the lines 22 and 24 and the position of these ports are shown at 27*a* in relation to the control module CM shown in FIG. 2. The control module CM may be a single element all molded in one piece of Neoprene or the like, the partitions 25 forming individual barriers which can be simply snipped away to interconnect one port 27 with another.

The cover plate CP shown in FIGS. 3, 6 and 7 has a corresponding pattern of O-ring receiving grooves 18*c* and 20*c*, and partition receiving grooves 23*a* and 25*a*, the positions of the valve ports 27 being shown at 27*b*. The grooves 25*a* surrounding three of the positions 27*b* for the upper left valve unit have been cross hatched in FIG. 3 to indicate where the corresponding partitions 25 of the control module CM for sealing around each port 27 of the valve unit would be positioned.

As shown in FIG. 7 the valve units 26 when mounted on the circuit board assembly have valve ports 27c matching the valve ports 27 of the base plate as shown in my copending application and are provided with O-rings 29 for sealing the ports 27 and 27c relative to each other.

In FIG. 8 a circuit pattern sheet of paper or the like is shown which may be provided to assist the designer of a circuit board assembly in connecting together proper valve ports of the various valve units mounted on the circuit board. The positions of the bolts 18 and 20 are applied to the pattern sheet 28 as indicated at 18e and 20e respectively. The positions of the ports are indicated at 27d. The designer of the circuit draws in the various required circuit lines (here indicated as 30 to 36 inclusive). For instance, circuit 30 may connect ports 27d which are indicated 1 and 2, circuit 31 may connect ports 27d which are indicated 3, 4, 5 and 6, circuit 32 may connect ports indicated as 7 and 8, circuit 33 may connect ports 9 and 10, 34 connects 11 and 12, 35 connects 13 and 14, and 36 connects 15 and 16. This pattern sheet is then used for snipping out circuit areas of the control module CM indicated in FIG. 9 as 40 to 46 inclusive. By way of example, the circuit area 40 is provided in the control module by snipping out partitions 50 to 55 inclusive (shown dotted). Similarly, other partitions or barriers of the control module CM in FIG. 2 are snipped out as illustrated in FIG. 9 to furnish the circuit areas 40 to 46 corresponding to the circuit lines 30 to 36 of FIG. 8.

From the foregoing description it will be obvious that I have provided a circuit board assembly in which the type of control module illustrated in FIGS. 2 and 5 provides a conveniently modified module by snipping out certain of the partitions 25 to provide the circuit areas such as shown at 40 to 46 inclusive in FIG. 9. When the valve units 26 are assembled to the circuit board, the various units have their valve ports 27c sealed relative to the valve ports 27 by the O-rings 29 and thus the proper ports of each valve unit communicates with a specific one of the circuit areas 40 to 46.

The matching grooves in the cover plate CP confine the partitions of the molded module CM and thereby prevent displacement under the effects of air pressure. The control module in its initial form blocks all circuit passages, but desirable circuit passages are made by cutting out the appropriate partitions. Since each valve unit mounts with the two bolts 20 to the circuit board, adequate clamping of the gasket-like control module is assured with two bolts for each area defined by the lines 22 and 24 in FIGS. 1 and 8. The spacer rings 21 shown in FIG. 7 assure proper squeeze of the gasket-like control module CM without excess pressure and in a manner to keep the adjacent surfaces of the base plate BP and the cover plate CP parallel to each other, thus preventing warpage of either one and consequent leakage.

Spaces between the partitions 25 represent potential circuit passages and the pattern shows exactly where to cut them for a particular circuit which can be done with a pair of scissors. Neoprene or Buna N, polychlorprene or some cellular material such as cork particles or granules which are Neoprene covered and in which the Neoprene bonds the cork particles are all satisfactory as materials for the control module.

Some changes may be made in the construction and arrangement of the parts of my circuit board and control module without departing from the real spirit and purpose of my invention, and it is my intention to cover by my claims any modified forms of structure or use of mechanical equivalents which may reasonably be included within their scope.

I claim as my invention:

1. In a circuit board and control module for fluid logic circuit mechanisms, an assembly comprising a base plate, a cover plate, and a control module between said base plate and said cover plate, said base plate being adapted for the mounting of valve units thereon, and means for holding said base plate, control module and cover plate in assembled, stacked, fluid tight relationship, said base plate having fluid passageways for communication with the ports of valve units mounted on said assembly, said control module having a plurality of openings therethrough defined by partitions between said openings, said partitions being readily removable to provide predetermined circuit areas for connecting together specific ports of different valve units mounted on said assembly, and said control module including sealing unit portions for cooperation with said means for holding to seal said means for holding from said circuit areas.

2. A circuit board and control module in accordance with claim 1 wherein said means for holding said base plate, control module and cover plate in assembled, stacked, fluid tight relationship comprises clamp bolts extending from the valve units and through said base plate, control module and cover plate, said clamp bolts also clamping the valve units to said assembly.

3. A circuit board and control module in accordance with claim 2 wherein said sealing unit portions of said control module comprise O-ring portions surrounding each clamp bolt.

4. A circuit board and control module in accordance with claim 2 wherein said circuit areas are sealed relative to the ports of the valve units by ring seals between the valve units and said fluid passageways of said base plate.

5. A circuit board and control module according to claim 1 wherein said cover plate has grooves corresponding to each of said partitions to hold them against lateral displacement and increase the sealing effectiveness against fluid pressure loss between said control module and said cover plate.

6. A circuit board and control module according to claim 2 wherein sleeves are provided surrounding said clamp bolts and interposed between said base plate and said cover plate to limit compression of said partitions.

7. A circuit board and control module according to claim 3 wherein said cover plate has grooves corresponding to each of said partitions and said O-ring portions to hold them against lateral displacement and increase the sealing effectiveness against fluid pressure loss between said control module and said cover plate.

8. A circuit board and control module according to claim 3 wherein sleeves are provided surrounding said clamp bolts and interposed between said base plate and said cover plate to limit compression of said partitions and said O-ring portions.

9. A circuit board and control module according to claim 2 wherein additional clamp bolts extend through said base plate, said control module and said cover plate in areas thereof outside the valve units mounted on said assembly and serve as means to mount the assembly and valve units.

10. In a circuit board and control module for fluid logic circuit mechanisms, an assembly comprising a base plate, a cover plate, and a control module between said base plate and said cover plate, said base plate being adapted for the mounting of valve units thereon, and means for holding said base plate, control module and cover plate in assembled, stacked, fluid tight relationship, said base plate having fluid passageways for communication with the ports of the valve units mounted on said assembly, said control module having a plurality of openings therethrough defined by partitions between said openings, said control module being formed of readily-cut material to facilitate the formation of predetermined circuit areas connecting together certain ports of different valve units mounted on said base plate by cutting out certain of said partitions, and said control module including sealing unit portions for cooperation with said means for holding to seal said means for holding from said circuit areas.

11. An assembly for use in a fluid logic circuit mechanism comprising a base plate, a control module against said base plate and a cover plate against said control module, means for holding said base plate, said control module and said cover plate in assembled, stacked, fluid tight relationship, said base plate having a recurring pattern of fluid connection perforations for fluid passageways of fluid logic valve units adapted to be mounted on said base plate in alignment with selected ones of said perforations, said control module having a recurring pattern of fluid connection perforations aligned with said base plate perforations and an array of partitions, certain of which may be removed to provide fluid conducting slots connecting some of said fluid connection perforations of said control module to serve as lateral fluid connections between various of said base plate perforations and the valve units served thereby, and said control module including sealing unit portions for cooperation with said means for holding to seal said means for holding from said lateral fluid connections.

References Cited

UNITED STATES PATENTS

| | | | |
|---|---|---|---|
| 2,834,368 | 5/1958 | Gray | 137—271 |
| 2,871,886 | 2/1959 | Obrebski et al. | 138—111 |
| 3,076,473 | 2/1963 | Wadey | 137—271 XR |
| 3,135,290 | 6/1964 | Carls | 138—111 XR |
| 3,229,705 | 1/1966 | Norwood | 137—81.5 |

OTHER REFERENCES

"Modular Pneumatic Logic Package," R. F. Langley et al. I.B.M. Technical Disclosure Bulletin, vol. 6, No. 5, October 1963, pp. 3, 4. (Copy in Scien. Lib. and Group 360 137/81.5.)

"Universal Modular System for Pneumatic Switching Controls," L. A. Steiner, Process Control and Automation, vol. 11, No. 7, July 1964, pp. 310–312 (copy in Scien. Lib. and Group 360, 137/81.5).

SAMUEL SCOTT, *Primary Examiner.*